United States Patent
Rodilla Sala et al.

(10) Patent No.: US 8,744,788 B2
(45) Date of Patent: Jun. 3, 2014

(54) MICRO-METER FOR ELECTRICAL ENERGY CONSUMPTION

(76) Inventors: Vicente Rodilla Sala, Valencia (ES); Javier Sanchis Muñoz, Valencia (ES)

(*) Notice: Subject to any disclaimer, the term of this patent is extended or adjusted under 35 U.S.C. 154(b) by 363 days.

(21) Appl. No.: 13/147,801

(22) PCT Filed: Feb. 2, 2010

(86) PCT No.: PCT/ES2010/070053
§ 371 (c)(1),
(2), (4) Date: Aug. 3, 2011

(87) PCT Pub. No.: WO2010/089438
PCT Pub. Date: Aug. 12, 2010

(65) Prior Publication Data
US 2012/0101752 A1   Apr. 26, 2012

(30) Foreign Application Priority Data
Feb. 3, 2009   (ES) .................................. 200900299

(51) Int. Cl.
*G06F 19/00* (2011.01)
*G01R 15/14* (2006.01)

(52) U.S. Cl.
CPC .................................. *G01R 15/142* (2013.01)
USPC ........................................................ 702/62

(58) Field of Classification Search
CPC .................................................... G01R 15/142
USPC ......................................................... 702/62
See application file for complete search history.

(56) References Cited

U.S. PATENT DOCUMENTS 5,185,705 A * 2/1993 Farrington ..................... 700/292
6,292,717 B1   9/2001 Alexander et al.

FOREIGN PATENT DOCUMENTS

EP       0981053 A1   2/2000
WO   WO 0221660 A1   3/2002

OTHER PUBLICATIONS

International Search Report, mailing date Jun. 10, 2010, for corresponding International Application No. PCT/ES2010/070053.

* cited by examiner

*Primary Examiner* — Bryan Bui
(74) *Attorney, Agent, or Firm* — Intellectual Property Law Group LLP

(57) ABSTRACT

This invention is an encapsulated Micro-Meter-Manager for Electrical Energy Consumption (1), including: A current ring transformer +Voltage pickup on each wire by spikes which traverse the insulation of the wire as far as its metallic core or by screwed terminals +Miniaturized power supply source +Microprocessor/s +Button cell +Digital memory +Clock +Power Line Communication PLC Modem, which injects the data into the actual wire via the same spikes for the pickup of voltage or terminals +Solid state relay (SSR) for individually managing the actual load: From a ceiling light to a water heater or any industrial machine. Its aim is to provide own intelligence on the loads and to avoid undesired consumptions: controlling the stand-by, carrying out predictive maintenance according to its rated consumptions and managing any possible overloads, under a certain pre-established and reprogrammable logic. With this, an increase in the comfort and the safety of the entire installation is also achieved.

20 Claims, 7 Drawing Sheets

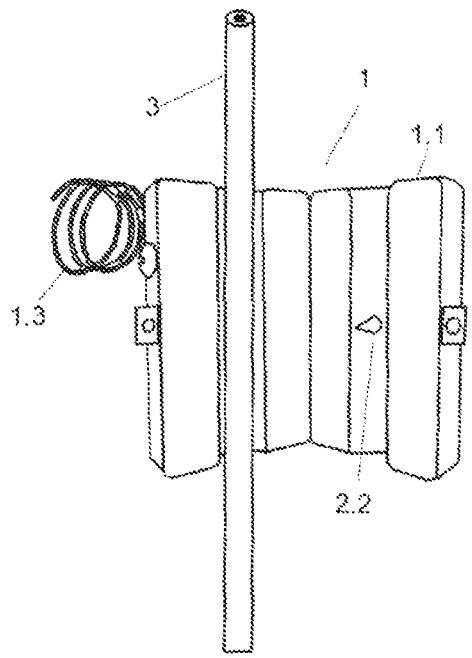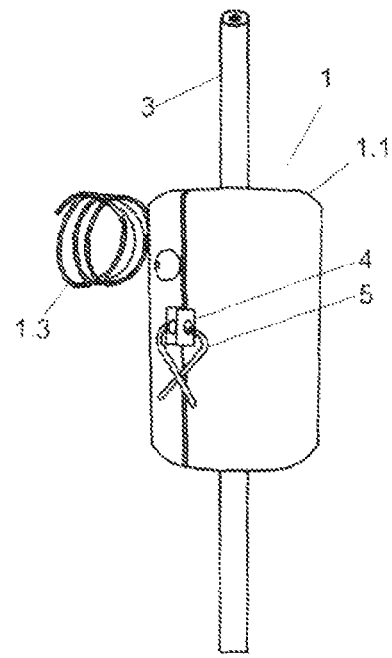
FIGURE 2A          FIGURE 2B
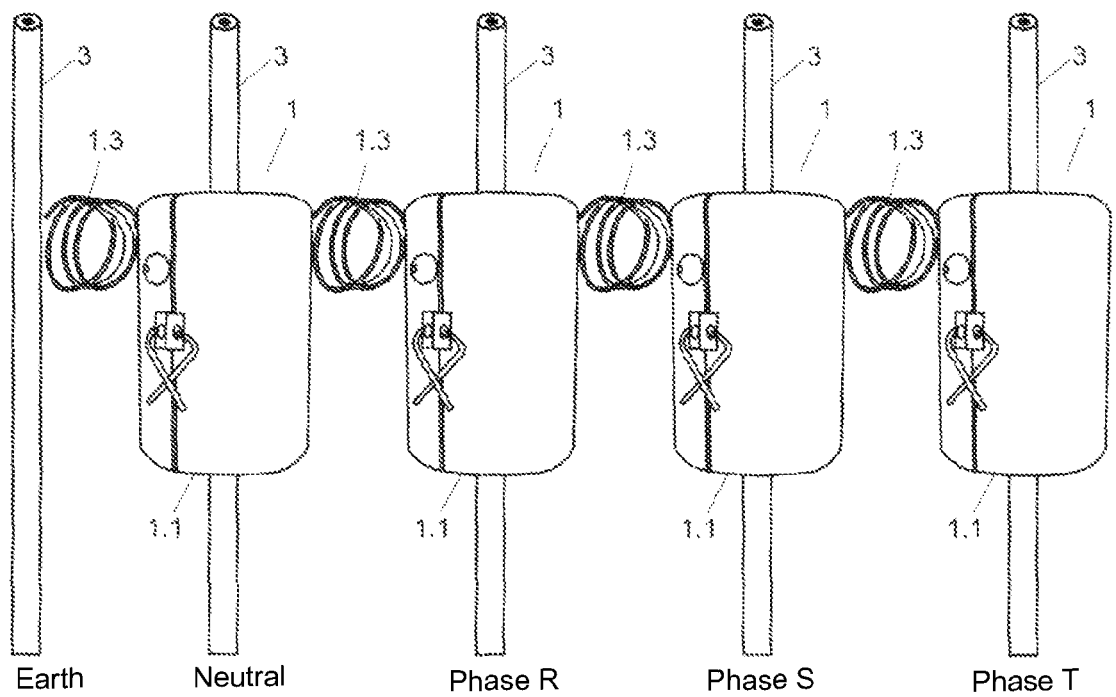
FIGURE 2C

MICRO-METER FOR ELECTRICAL ENERGY CONSUMPTION

CROSS-REFERENCE TO RELATED APPLICATIONS

This application is a U.S. National Phase application, under 35 U.S.C. §371, of International Application no. PCT/ES2010/070053, with an international filing date of Feb. 2, 2010, and claims benefit of Spanish Application no. ES P200900299 filed on Feb. 3, 2009, which are hereby incorporated by reference for all purposes.

The industrial sector to which this invention belongs is that of electrical apparatus. It consists of a miniaturized and encapsulated electronic device which clasps the power supply wires of a load and acts as a network analyzer, electrical energy meter and programmable automaton; and with the capacity for qualitatively and quantitatively measuring power and energy consumptions; it also manages certain previously programmed operating conditions—connecting and disconnecting the measured load. Also allowing the load itself to intercommunicate with the rest of the electrical installation—of the domotic, inmotic or industrial type—by means of a certain predefined logic; for the purpose of optimizing the energy efficiency of said load, its predictive maintenance, technical alarms, stand-by, overloads, over-consumptions, tappings or other functions and incidents which might affect both the manufacturer of the load as well as the user, the electrical company and the appropriate Administration.

BACKGROUND OF THE INVENTION

The majority of electrical energy meters (active/reactive) that are used nowadays, both domestic and industrial, are apparatus which measure that energy by integration of the power (active/reactive) as a function of time.

In terms of their construction there are two basic types of meter:

Induction meter: meter in which the currents circulating through fixed windings react on the currents induced in the mobile conductor element, generally a disc, causing it to move.

Static meter: meter in which the current and voltage act on solid state (electronic) elements and produce frequency pulses in the output that are proportional to watts per hour, or volt-amp-react×h.

Moreover, the demand for broadband telecommunications services among domestic clients and small businesses has found itself being satisfied in two ways: by means of ADSL lines or with links contracted from cable operators. As competition and/or complement to these solutions, a new alternative has arisen within electrical companies which, based on the existing infrastructures associated with the electrical distribution and by means of using PLC (power line communication) technologies, is capable of converting the power sockets of end users into access points to a telecommunications network.

Based on this technology and on his own previous invention now being used by various international electrical companies and described in patent EP0981053 titled "Programmable Monitoring Device for Electric Consumption", the author of this invention has developed a new micro-meter-manager for electrical energy that is much more sophisticated, practical and economical, and which is described below.

DESCRIPTION OF THE INVENTION

This invention consists of a miniaturized and encapsulated micro-meter for electrical energy consumption with capacity for load management, comprising: a current ring transformer; a voltage pickup on the actual wire by means of spikes which pass through its insulation as far as the metallic core, or by means of insulated and screwed terminals; a conventional power supply source; a microprocessor, a button cell; digital memory; clock; power line communication PLC modem (TPC-IP), which injects/receives data on the actual wire via the same voltage pickup spikes or terminals; solid state relay (SSR) for individually managing the actual load: from a light plafond to a water heater, being applicable to any domestic appliance, and even to production machinery or other electrical equipment in domestic and industrial installations.

It is manufactured in two versions: meter and meter-manager; both of them can be single phase or three phase:

The three phase meter version is made up of four individual open-core micro-meters, three for the phases and one for neutral. In order fit it, there is no need to cut the wires, instead it is opened like a clamp and then closed, clasping each conductor, with its spikes piercing the insulation until reaching as far as the core of the wire. This permits the voltage to be picked up, self-feeding and injecting/receiving the PLC signal. The current transformer of this version is therefore of the split core type, incorporating an earth connection for its internal electronics.

The meter-manager version consists of two pluggable parts in which the ends of the five wires (three phases, neutral and earth) are connected. In order to fit this, the wires feeding a receiver or circuit are cut, some ends are attached to the wires and they are screwed into the terminals. This version can be manufactured for single phase loads of low power. The current transformer of this version is therefore closed core, though an open core could also be applied.

USE AND CHARACTERISTICS: By means of a touch sensitive screen of a central CPU (PC or similar) the following functions can be displayed and parameterized:

Self-diagnostic function so that each user can optimize his or her own contracted power and check the power of the load.

General or individual measurer of the instantaneous power consumption in currency/hour (e.g. €/h) and cost of the accumulated electrical energy in currency (e.g. €) of each one of the domestic appliances, lights, production machinery and other services.

Possibility of quantifying alarms in terms of electrical energy excesses and associated cost by loads or by zones. As well as by manufactured lots or services provided. Calculation of specific electrical costs per unit of production or service provided: Real electrical efficiency.

Predictive maintenance system, based on its own curves for start-up, functioning and stoppage, in order to learn whether the electrical apparatus are consuming as they ought in power (W) and in energy (kWh), or whether any hidden breakdown is causing a higher or lower electrical consumption than the rated value in W or its equivalent in €/h (or other currency/hour).

Possibility of carrying out automation and thermostatic, pressurestatic, crepuscular, etc., management via PLC at a cost that is easily amortizable.

Automatic modulation of the power excesses in order to avoid having to suffer power cuts and/or surges, with the actual loads being self-managed individually and/or globally in accordance with a pre-established logic.

Installation of indicators of the pilot light type so as to prevent forgetting to switch off lights, air conditioning, computers, domestic appliances, etc.; thus avoiding unnecessary expenses and $CO_2$ emissions, and even accidents.

From the touch sensitive screen, it is also possible to display the following consumption parameters:

| PARAMETERS | MEASUREMENT UNIT |
|---|---|
| 24 hourly energy costs (24 hours/day) | €/kWh according to different periods |
| Active energy | kWh |
| Reactive energy | kVARh |
| Voltages by phase | V |
| Currents by phase | A |
| Frequency | Hz |
| Active power | kW |
| Inductive reactive power | kVAR-L |
| Capacitive reactive power | kvar-C |
| Apparent power | PF |
| Cos φ | Cos φ |
| Maximum power demanded | Pd |
| Neutral current | In |
| Harmonics | Of all kinds |
| Micro-cuts | As per supplier and country |

Advantages: This micro-meter has a series of potential advantages which are described below and which solve the present problems arising in projects at the highest technological level on the part of both the electrical companies and the manufacturing firms of electrical energy meters, as well as on the part of the manufacturers of domestic appliances, lamps and even machinery that has been introduced into industry and society and which have now been technically solved.

By optimizing the consumption, the emissions of $CO_2$ and contaminating gases into the atmosphere can be reduced: the micro-meter can, when introduced on a mass scale in each country, avoid the need for new generation plants in the short and medium term.

Facilitating the integration of the distributed generation: the integrating function of the interconnection lines properly managed by a system such as the micro-meter, installed on a regulatory basis in homes and industries, is going to be fundamental.

Diversifying the sources of generation, thereby reducing the energy dependence with respect to other countries: the micro-meter is a source of the fifth fuel, in other words, of the most ecological fuel and at the best price, as is energy efficiency.

Improving the energy efficiency of the consumption points: the micro-meter provides the consumer with detailed and instantly available information on his or her consumptions in terms of load, facilitating action on them without this implying any modification to the degree of comfort, furthermore being able to detect possible losses or overloads in the network and displaying those points of the installation that require maintenance (predictive control).

Improving the quality of the electrical energy supply: the micro-meter will reduce the effect of peaks in the global demand curve, or these will be displaced to moments of greater availability of renewable energies, making it possible to reduce interruptions in the energy supply and thereby improve its quality at the national level.

Improving the efficiency in the use of the electrical infrastructures: the micro-meter would allow any existing infrastructures, which need to be expanded in some points of the network, to be able to be still sufficient in the short and medium term, thereby avoiding the environmental and social impact of new network infrastructures.

Improving the information and management of consumptions by means of using Submetering and AMM (Automatic meter management): the use of a standard like that proposed in this invention and the management of the electrical consumptions in the installations of the users allow for a reduction in electrical consumption and in situ maintenance of the equipment on the basis of a continuous monitoring of the electrical consumptions and other control parameters. This avoids oversights and negligence when it comes to audiovisual signals displayed to users.

BRIEF DESCRIPTION OF THE DRAWINGS

In order to complement the description of this invention and with the aim of facilitating an understanding of its characteristics, a set of figures is attached in which, in an illustrative and non-limiting manner, the following drawings have been represented whose main components are as follows:

FIGS. 1A, 1B, 2A and 2B show the unipolar micro-meter for a single phase installation (one module for phase and one module for neutral).

FIG. 1A is an elevation view of a unipolar micro-meter for the single/three phase installation in the open position. Standing out are its spikes and the interconnection wire.

FIG. 1B is an elevation view of a unipolar micro-meter for the single/three phase installation in the closed position.

FIG. 2A is an elevation view of a unipolar micro-meter in the open position, clasping the wire and the spikes until the insulation is pierced and the metallic core of the wire is reached.

FIG. 2B is an elevation view of the unipolar micro-meter in the closed position, with the wire installed and the seal located in the tab.

FIG. 2C shows the complete micro-meter for the three phase installation (one module per phase and one module for neutral). It is an elevation view of four unipolar micro-meters for three phase installation, located in each of the phases and neutral, and interconnected together by means of the wire. And with earth connection.

FIG. 3A is a perspective view of the micro-meter, single phase load manager version, in the open position.

FIG. 3B is a perspective view of the micro-meter, single phase load manager version, in the closed and sealed position.

FIG. 4 is a diagram of the entire network of data gathering, reception and transmission; which permits the individualized measurement of energies consumed by each load, along with its localized management of the electrical demand on a computer assisted basis.

FIG. 5 is a diagram demonstrating the use of the micro-meter-manager in a home. Starting from the central meter, all the outlet lines, micro-meters-managers for the lighting circuits, washing machine, oven, power sockets, etc., are connected up, and also as an individual meter; in other words, in the head and per receiver, as shown in FIG. 6.

FIG. 6 is a view of an example of individual application, in this case a washing machine, which has its own micro-meter-manager incorporated, and which, via the selector, permits a view to be had in the display of, for example, the instantaneous expense in €/h, its equivalent in kg of $CO_2$ emitted per hour, the unit expense per wash in €/wash, the energy consumed in kWh between periods or cycles, its equivalent in kg in $CO_2$ per wash, the power in kW, the voltage in V, the amps in A, the reactive power, the cos phi, ... etc. Even the power is monitored, verifying the time curves for start-up, functioning and stoppage, as well as the energy demand curve as a function of time. This example is applicable to any domestic appliance and to any industrial machine or equipment, with the added advantage of permitting the specific operating costs to be known at the industrial level in units produced per unit of electrical cost; in other words, sampling the electrical energy in order to be able to optimize it.

Figure 1A:
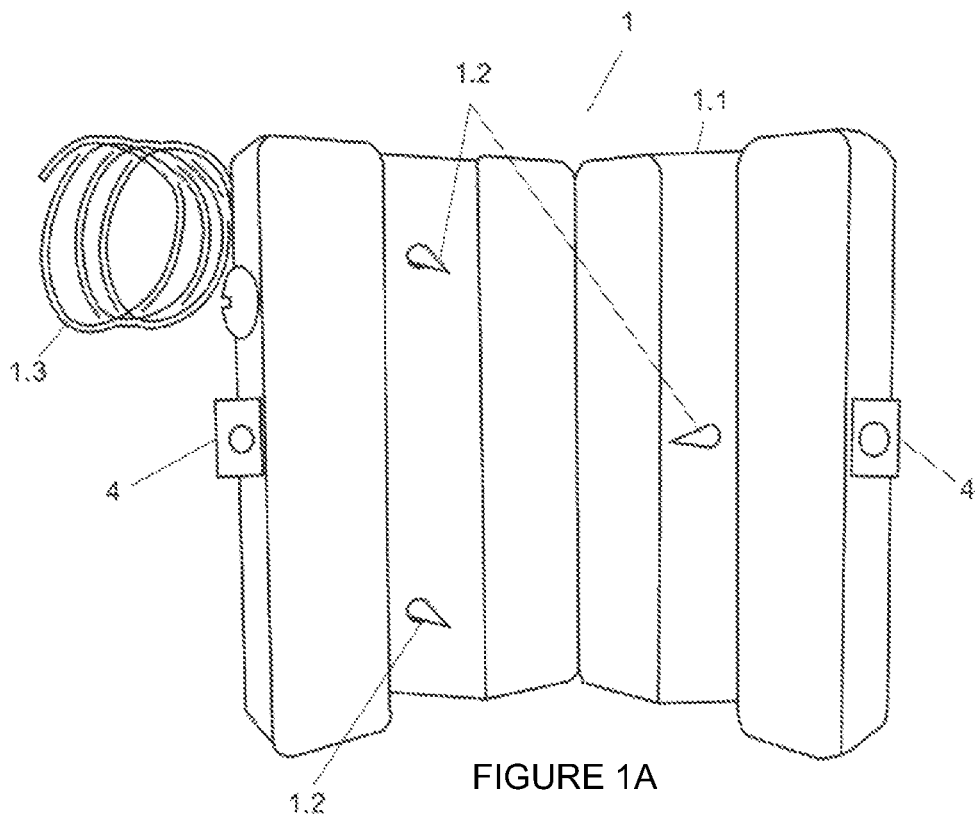
Figure 1B:
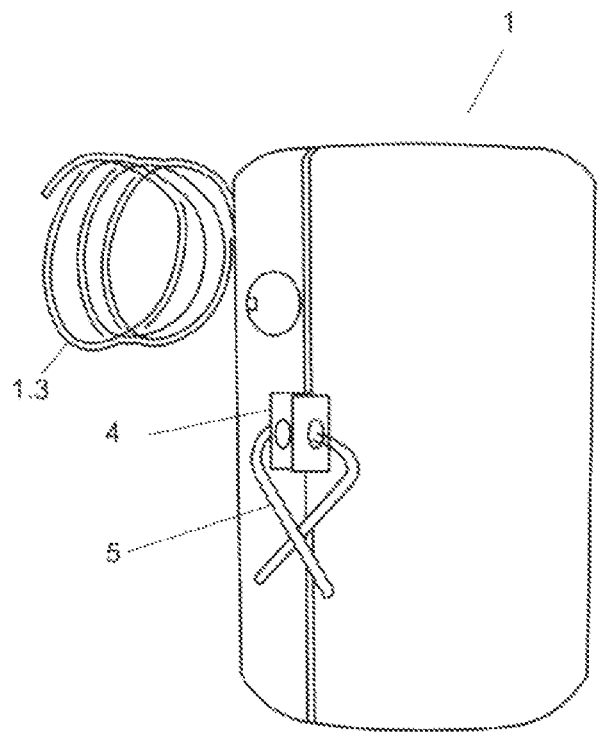

In these figures, the numerical references correspond to the following parts and elements:

1.1. Hinged Casing
1.2. Spikes for pickup of voltage and PLC communication
1.3. Wire for interconnection and feed among modules
2.1. Pluggable Half-Casing
2.2. Fastening screw for the wire
2.3. Pin
2.4. Socket
2.5. Hook for clipping of the capsule
3. Wire
4. Securing tab for the seal
5. Seal
6. Home
7. Factory
8. Central meter (single phase or three phase)
8.1. Touch Sensitive Screen
9. Electrical network
10. PLC (power line communication) concentrator
11. Modem
11.1. Antenna
12. Control centre
13. Monitor
14. Lamp
15. Washing machine
15.1. Selector
15.2 Display
15.3 Reset
15.4 Motor
16. Refrigerator
17. Air conditioning equipment Preferred Embodiment of the Invention Among the different types and embodiments of micro-meters (1) for electrical energy that can be manufactured, taking this invention as the basis, the three phase version is described below:

Starting from the design and selection of all its components, the four micro-meters are assembled, clasping each electrical feed wire (phases and neutral) with the core open until it is closed and the spikes (1.2) pierce the insulation of the conductor as far as reaching the metallic core of the wire (3).

Figure 3A:
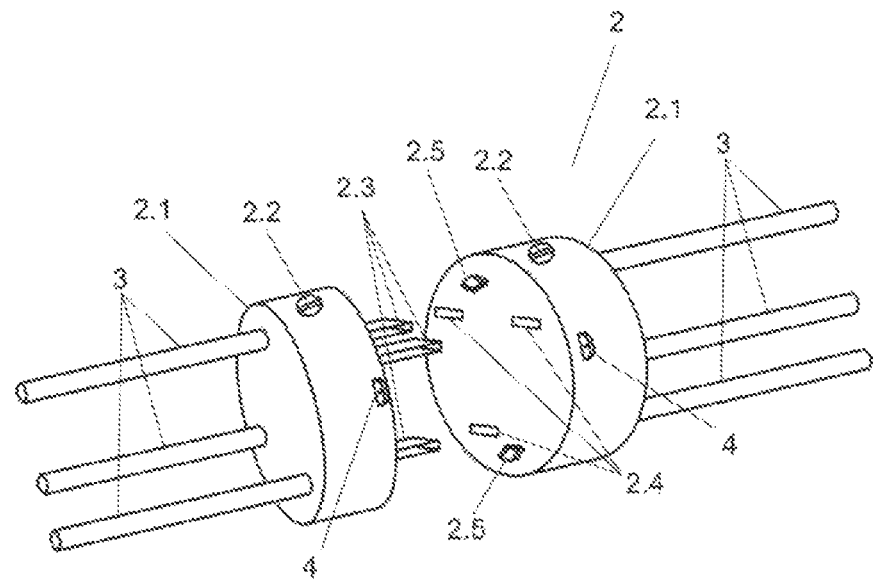
FIGS. 3A, 3B, 4, 5 and 6 show the micro-meter-manager in its single and three phase version.
Figure 3B:
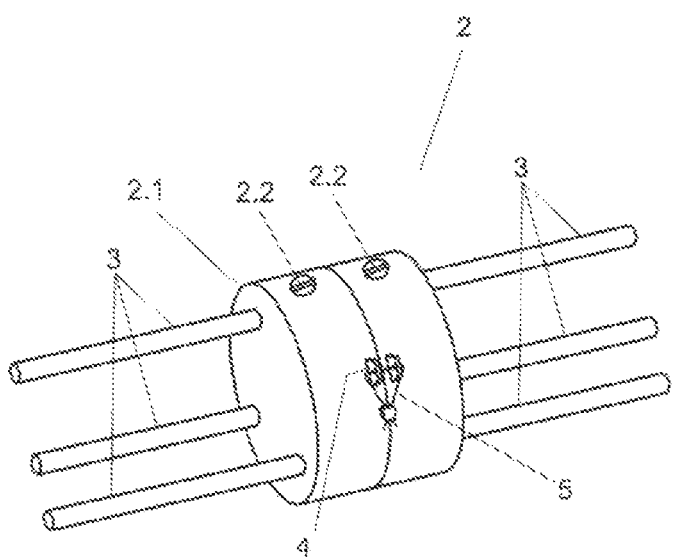
Figure 4:
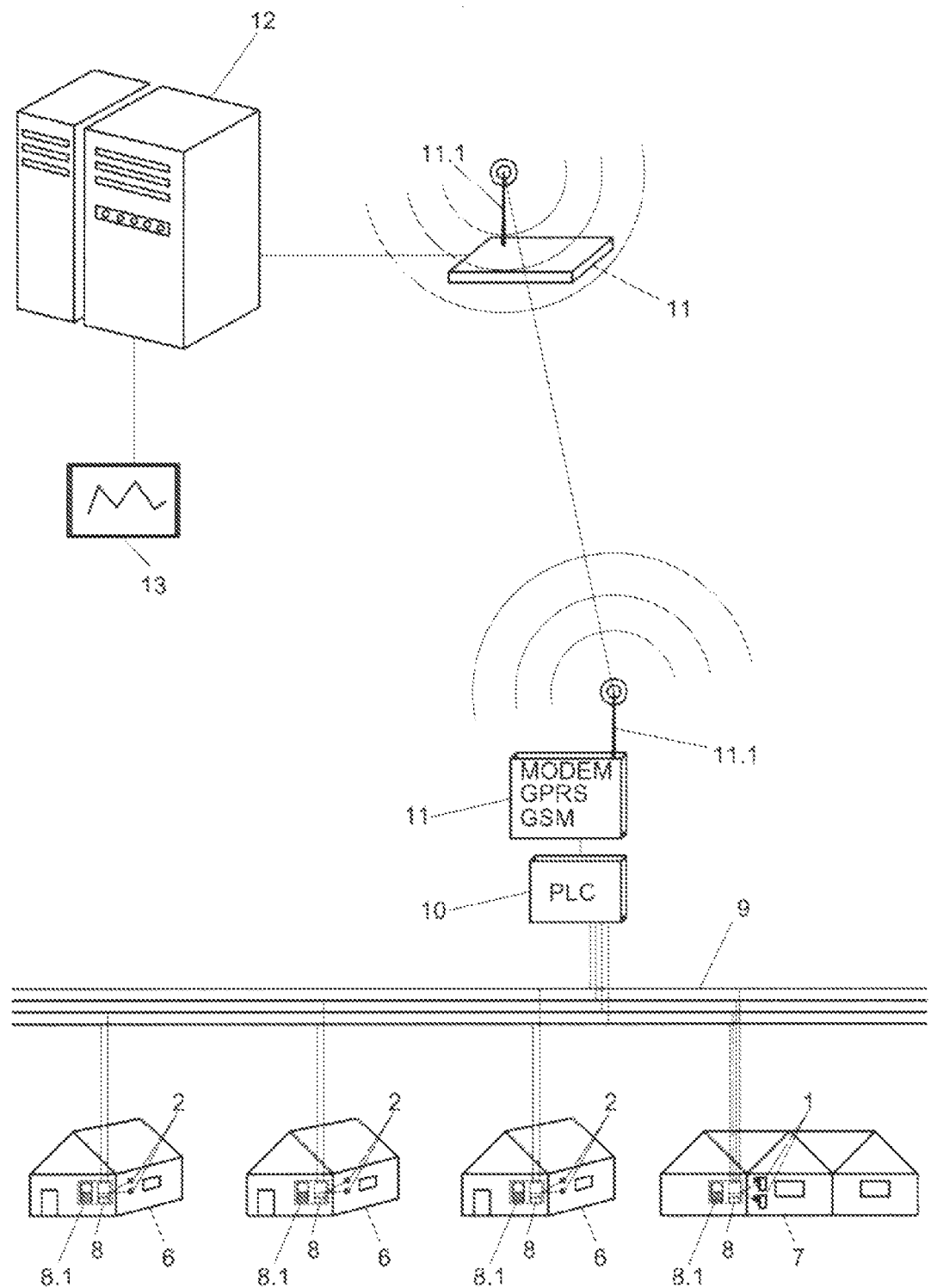
Figure 5:
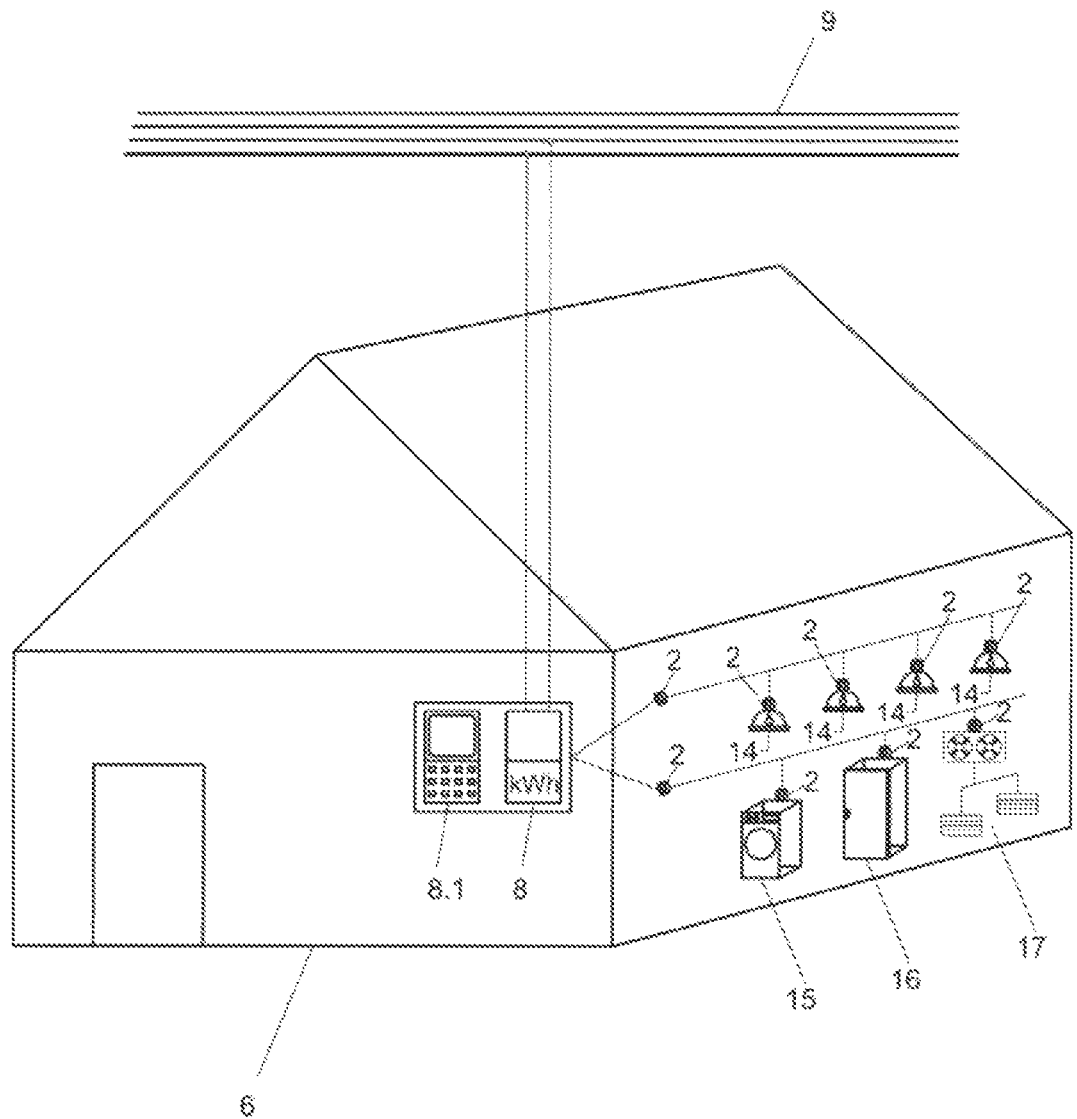
Figure 6:
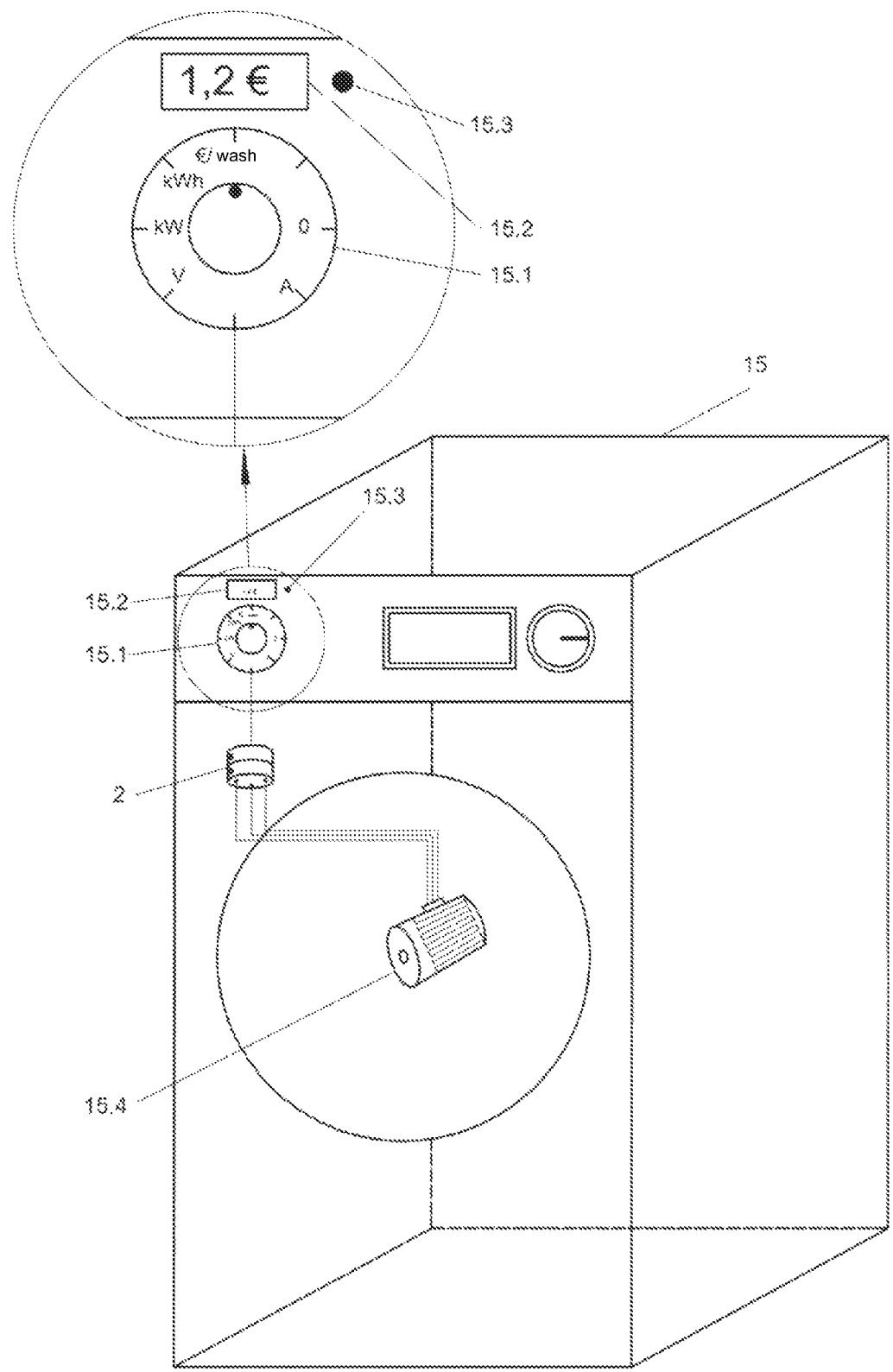
Figure 7:
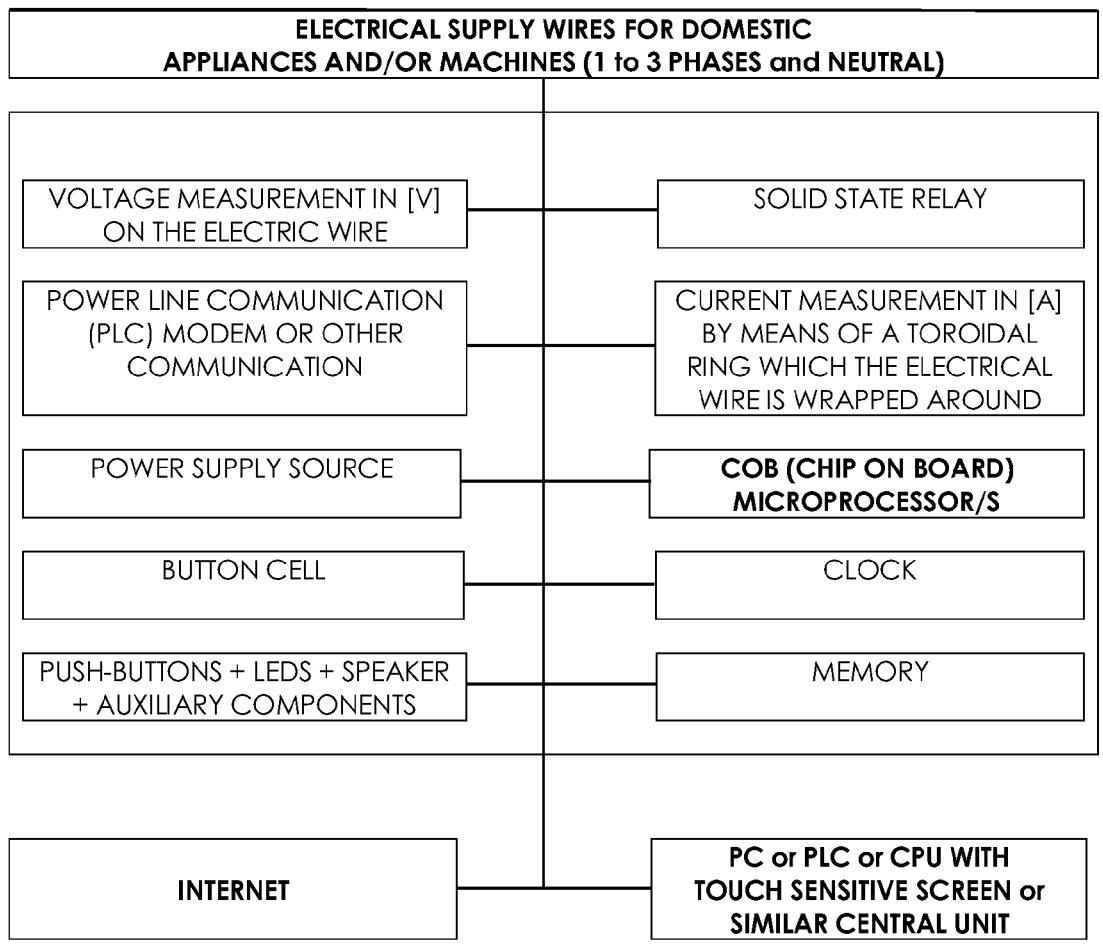
FIG. 7 shows a schematic diagram of the blocks making up the micro-meter-manager.

In order to operate the three phase load; in other words, connect it or disconnect it, the version to install is that described in FIGS. 3A and 3B, in which the system acts on a solid state relay (SSR) that is incorporated, which opens or closes the electrical supply for the load.

Each micro-meter unit consists of a hinged casing (1.1), a split core current ring transformer, a voltage transformer, power supply source, microprocessor/s, button cell, digital memory, clock, PLC modem (11), warning LEDs, optionally a solid state relay, operating buttons, etc.; at all times in accordance with the regulations on electrical meters and other technical legislation in force in each country.

Prior to its assembly, its functioning is checked and it is calibrated. Calibration is understood to be the set of operations, undertaken in accordance with one or several precisely defined and documented procedures, which compare the values of a magnitude indicated by a measuring instrument, certified under official traceability, and the corresponding values of that magnitude indicated by reference standards, in order thereby to be able to establish the error with which the instrument measures that magnitude.

Having sufficiently described the nature of this invention, along with a practical application of it, it merely remains to add that both its form and the materials and method of manufacture are susceptible to modifications, always provided they do not substantially affect the characteristics that are claimed below.

The invention claimed is:

1. A micro-meter for electrical energy consumption, encapsulated and miniaturized for its easy fitting on actual supply wires, both in the head of electrical installations and in the interior of domestic appliances, lamps or any kind of machine; wherein the main components of each unipolar unit (one to three for the phases and one for neutral) of the version for single/three phase installation comprise:
a hinged casing (1.1);
a split core current transformer for measuring current circulating through a conductor;
a voltage transformer;
a plurality of spikes protruding from an inner surface of the hinged casing, able to pierce into a metallic core of the conductor, via an insulation of the wire, for pickup of voltage and injection and reception of coded signals by means of PLC (Power Line Communication) technology (1.2);
a Power Line Communication PLC Modem (11) which injects and receives data from the actual wire of the electrical network;
a miniaturized power supply source;
a microprocessor, a button cell, a digital memory and a clock;
a solid state relay (SSR) or other technologies for connection/disconnection of a load in a manager model of the micro-meter; and
an earth connection.

2. The micro-meter for electrical energy consumption, according to claim 1, wherein the main components of the version which manages electrical loads in single phase or three installations comprise:
two pluggable half-casings (2.1);
a current transformer;
the voltage transformer;
pluggable pins for connection of the two half-casings (2.3);
internal voltage and current pickups and injection and reception of coded signals by means of PLC (Power Line Communication) technology;
the Power Line Communication PLC Modem (11);
the miniaturized power supply source;
the microprocessor, button cell; digital memory, clock; and
the earth connection.

3. The micro-meter for electrical energy consumption, according to claim 2, further comprising a chip which permits intercommunication of the actual load with the rest of the domotic or inmotic system by means of a certain computerized predefined logic, for the purposes of optimizing the energy efficiency, its predictive maintenance, technical alarms, power overloads, energy over-consumptions, stand-by, tappings or other functions and incidents of said load;

including the reduction in instantaneous and accumulated $CO_2$ emissions associated with the electrical use of said load.

4. The micro-meter for electrical energy consumption, according to claim 3, further comprising a computerized central unit (12) in which is stored and managed the general information on the intelligent system and which permits updating of the firmware of the micro-meters and micro-meters-managers, as well as the individual and general functioning logic of the entire unit.

5. The micro-meter for electrical energy consumption, according to claim 3, further comprising a means of communication via the Internet or other standards, via its ICP-IP identifier or other communications protocols, in order to permit a remote individual functioning of each micro-meter and micro-meter-manager, along with a remote general management of the entire unit.

6. The micro-meter for electrical energy consumption, according to claim 3, further comprising a necessary means and firmware for carrying out control in real time of time curves for power, energy and other electrical parameters, in accordance with standards provided by the manufacturer or the rated curves measured on the actual load; with an aim of carrying out predictive maintenance and calculation of specific costs of industrial production or of operating domestic services.

7. The micro-meter for electrical energy consumption, according to claim 2, further comprising a computerized central unit (12) in which is stored and managed the general information on the intelligent system and which permits updating of the firmware of the micro-meters and micro-meters-managers, as well as the individual and general functioning logic of the entire unit.

8. The micro-meter for electrical energy consumption, according to claim 7, further comprising a means of communication via the Internet or other standards, via its ICP-IP identifier or other communications protocols, in order to permit a remote individual functioning of each micro-meter and micro-meter-manager, along with a remote general management of the entire unit.

9. The micro-meter for electrical energy consumption, according to claim 7, further comprising a necessary means and firmware for carrying out control in real time of time curves for power, energy and other electrical parameters, in accordance with standards provided by the manufacturer or the rated curves measured on the actual load; with an aim of carrying out predictive maintenance and calculation of specific costs of industrial production or of operating domestic services.

10. The micro-meter for electrical energy consumption, according to claim 2, further comprising a means of communication via the Internet or other standards, via its ICP-IP identifier or other communications protocols, in order to permit a remote individual functioning of each micro-meter and micro-meter-manager, along with a remote general management of the entire unit.

11. The micro-meter for electrical energy consumption, according to claim 2, further comprising a necessary means and firmware for carrying out control in real time of time curves for power, energy and other electrical parameters, in accordance with standards provided by the manufacturer or the rated curves measured on the actual load; with an aim of carrying out predictive maintenance and calculation of specific costs of industrial production or of operating domestic services.

12. The micro-meter for electrical energy consumption, according to claim 1, further comprising a chip which permits intercommunication of the actual load with the rest of the domotic or inmotic system by means of a certain computerized predefined logic, for the purposes of optimizing the energy efficiency, its predictive maintenance, technical alarms, power overloads, energy over-consumptions, standby, tappings or other functions and incidents of said load; including the reduction in instantaneous and accumulated $CO_2$ emissions associated with the electrical use of said load.

13. The micro-meter for electrical energy consumption, according to claim 12, further comprising a computerized central unit (12) in which is stored and managed the general information on the intelligent system and which permits updating of the firmware of the micro-meters and micro-meters-managers, as well as the individual and general functioning logic of the entire unit.

14. The micro-meter for electrical energy consumption, according to claim 12, further comprising a means of communication via the Internet or other standards, via its ICP-IP identifier or other communications protocols, in order to permit a remote individual functioning of each micro-meter and micro-meter-manager, along with a remote general management of the entire unit.

15. The micro-meter for electrical energy consumption, according to claim 12, further comprising a necessary means and firmware for carrying out control in real time of time curves for power, energy and other electrical parameters, in accordance with standards provided by the manufacturer or the rated curves measured on the actual load; with an aim of carrying out predictive maintenance and calculation of specific costs of industrial production or of operating domestic services.

16. The micro-meter for electrical energy consumption, according to claim 1, further comprising a computerized central unit (12) in which is stored and managed the general information on the intelligent system and which permits updating of the firmware of the micro-meters and micro-meters-managers, as well as the individual and general functioning logic of the entire unit.

17. The micro-meter for electrical energy consumption, according to claim 16, further comprising a means of communication via the Internet or other standards, via its ICP-IP identifier or other communications protocols, in order to permit a remote individual functioning of each micro-meter and micro-meter-manager, along with a remote general management of the entire unit.

18. The micro-meter for electrical energy consumption, according to claim 16, further comprising a necessary means and firmware for carrying out control in real time of time curves for power, energy and other electrical parameters, in accordance with standards provided by the manufacturer or the rated curves measured on the actual load; with an aim of carrying out predictive maintenance and calculation of specific costs of industrial production or of operating domestic services.

19. The micro-meter for electrical energy consumption, according to claim 1, further comprising means of communication via the Internet or other standards, via its ICP-IP identifier or other communications protocols, in order to permit a remote individual functioning of each micro-meter and micro-meter-manager, along with a remote general management of the entire unit.

20. The micro-meter for electrical energy consumption, according to claim 1, further comprising a necessary means and firmware for carrying out control in real time of time curves for power, energy and other electrical parameters, in accordance with standards provided by the manufacturer or the rated curves measured on the actual load; with an aim of carrying out predictive maintenance and calculation of specific costs of industrial production or of operating domestic services.

* * * * *